(12) United States Patent
Senda

(10) Patent No.: US 9,628,067 B2
(45) Date of Patent: Apr. 18, 2017

(54) GATE DRIVER

(71) Applicant: DENSO CORPORATION, Kariya, Aichi-pref. (JP)

(72) Inventor: Yasutaka Senda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 101 days.

(21) Appl. No.: 14/601,344

(22) Filed: Jan. 21, 2015

(65) Prior Publication Data

US 2015/0236686 A1    Aug. 20, 2015

(30) Foreign Application Priority Data

Feb. 19, 2014   (JP) .................................. 2014-29605

(51) Int. Cl.
    H03K 3/00       (2006.01)
    H03K 17/082     (2006.01)
    H03K 17/60      (2006.01)
    H03K 17/687     (2006.01)

(52) U.S. Cl.
    CPC ......... H03K 17/0828 (2013.01); H03K 17/60 (2013.01); H03K 17/6877 (2013.01)

(58) Field of Classification Search
    None
    See application file for complete search history.

(56) References Cited

U.S. PATENT DOCUMENTS

| | | | |
|---|---|---|---|
| 9,240,713 B2* | 1/2016 | Yabuzaki | ................. H02M 1/44 |
| 2003/0197532 A1* | 10/2003 | Tsuchida | ............ H03K 17/0822 327/108 |
| 2006/0139085 A1 | 6/2006 | Okamura | |
| 2006/0261852 A1* | 11/2006 | Rabenstein | ........ H03K 17/0822 326/83 |
| 2009/0002054 A1 | 1/2009 | Tsunoda et al. | |
| 2013/0083442 A1 | 4/2013 | Hiyama | |
| 2014/0253184 A1 | 9/2014 | Yamauchi et al. | |
| 2015/0236686 A1* | 8/2015 | Senda | ................ H03K 17/0828 327/381 |
| 2015/0318850 A1* | 11/2015 | Hiyama | ............... H03K 17/163 318/400.26 |

(Continued)

FOREIGN PATENT DOCUMENTS

| | | |
|---|---|---|
| JP | 10-032476 A | 2/1998 |
| JP | 2005-253183 A | 9/2005 |

(Continued)

*Primary Examiner* — Lincoln Donovan
*Assistant Examiner* — Khareem E Almo
(74) *Attorney, Agent, or Firm* — Posz Law Group, PLC

(57) ABSTRACT

In a gate driver for driving a first transistor with a constant current, a constant current circuit supplies the constant current to a gate of the first transistor. A second transistor has a gate supplied with a gate reference voltage as a reference for a drive voltage to turn ON the first transistor and is connected in a forward direction in a path from the constant current circuit to the gate of the first transistor. A controller drives the first transistor by operating the constant current circuit when an ON instruction is inputted. The controller sets the gate reference voltage to a first value when the ON instruction is inputted and then changes the gate reference voltage to a second value greater than the first value when a predetermined timing comes under a condition where the first transistor is not in an overcurrent state.

12 Claims, 15 Drawing Sheets

(56) References Cited

U.S. PATENT DOCUMENTS

2015/0381152 A1* 12/2015 Choi ..................... G01K 7/22
361/106

FOREIGN PATENT DOCUMENTS

| JP | 2011-135731 A | 7/2011 |
| JP | 2012-114585 A | 6/2012 |
| JP | 2012-222498 A | 11/2012 |
| WO | 2013/094241 A1 | 6/2013 |

* cited by examiner

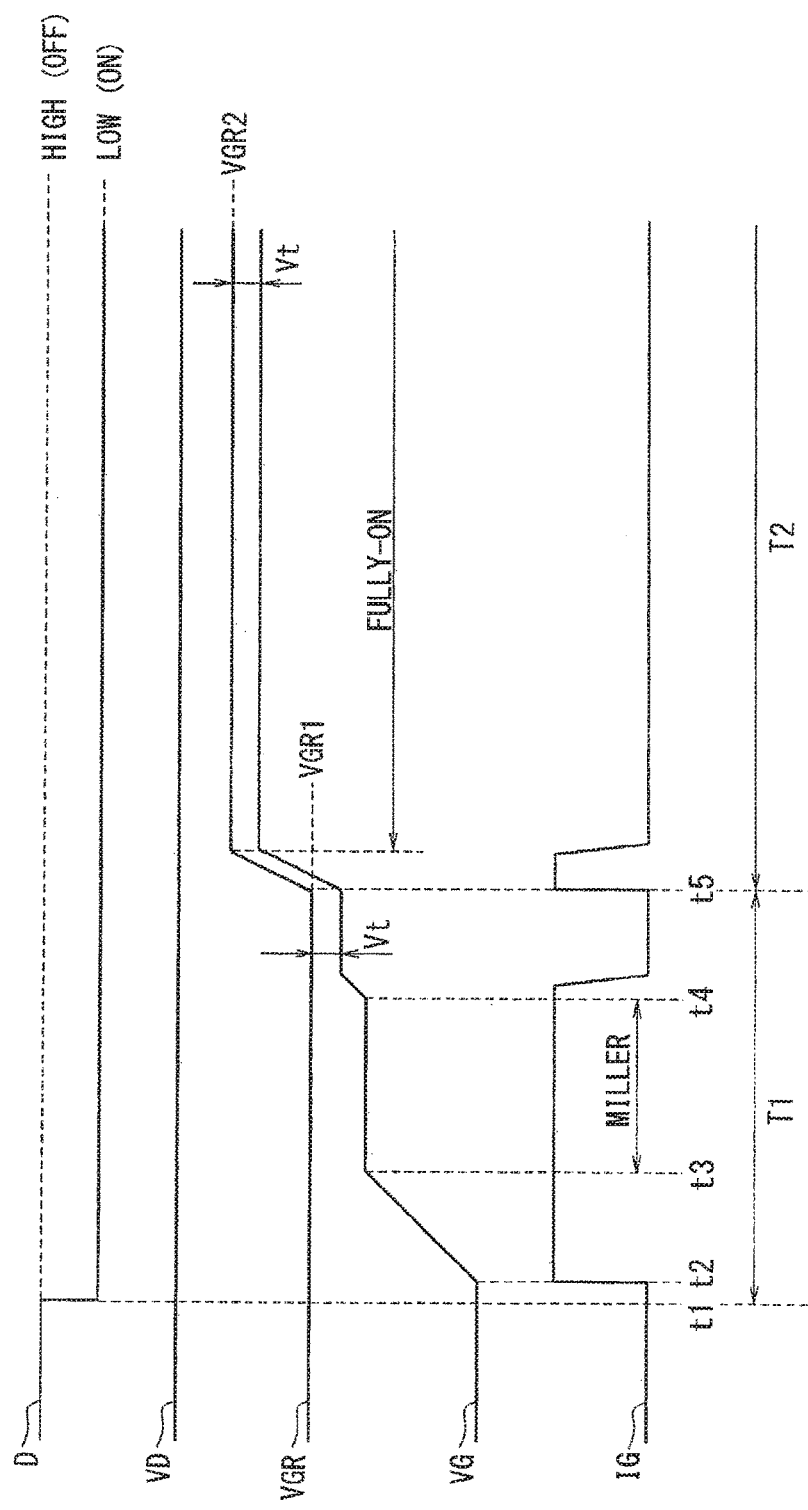

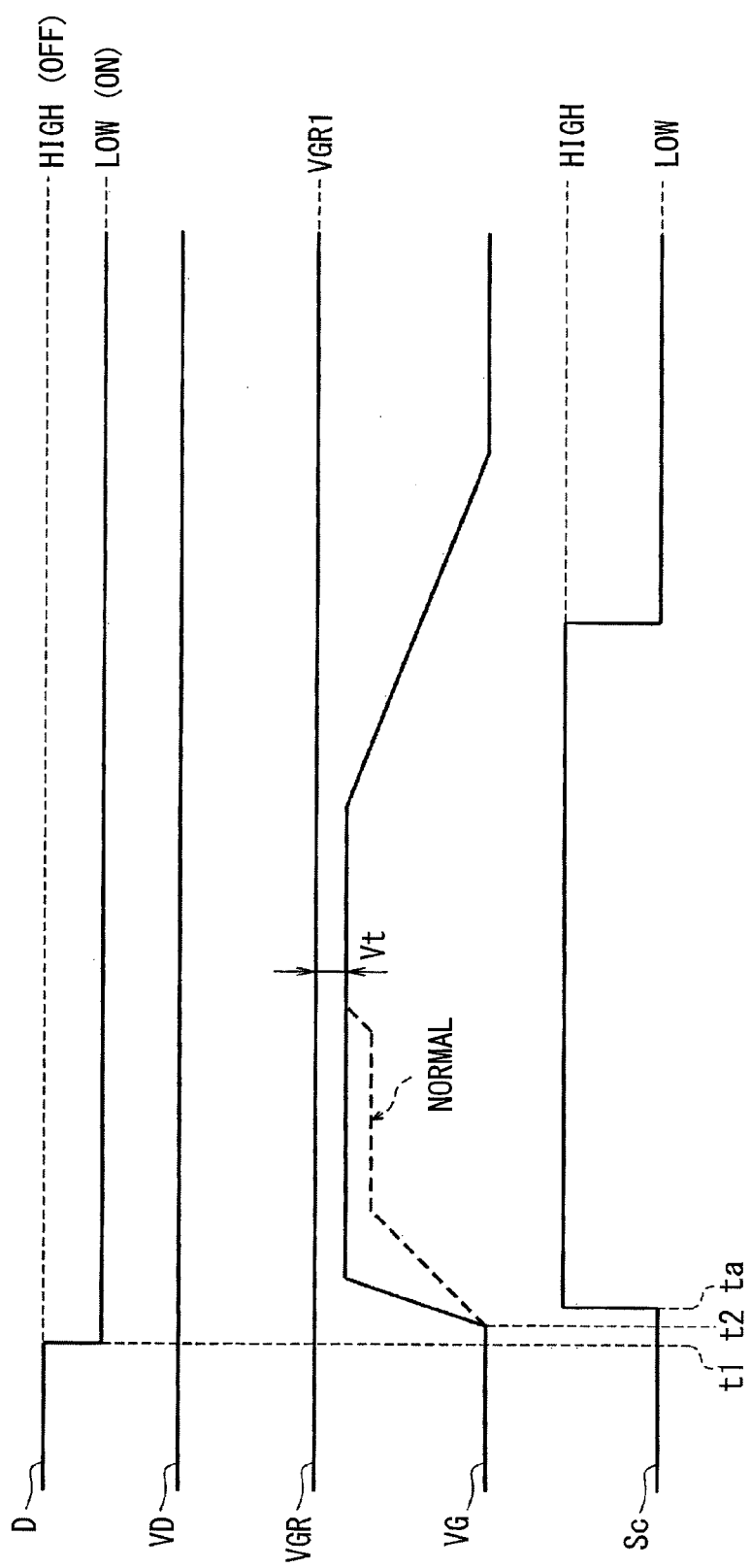

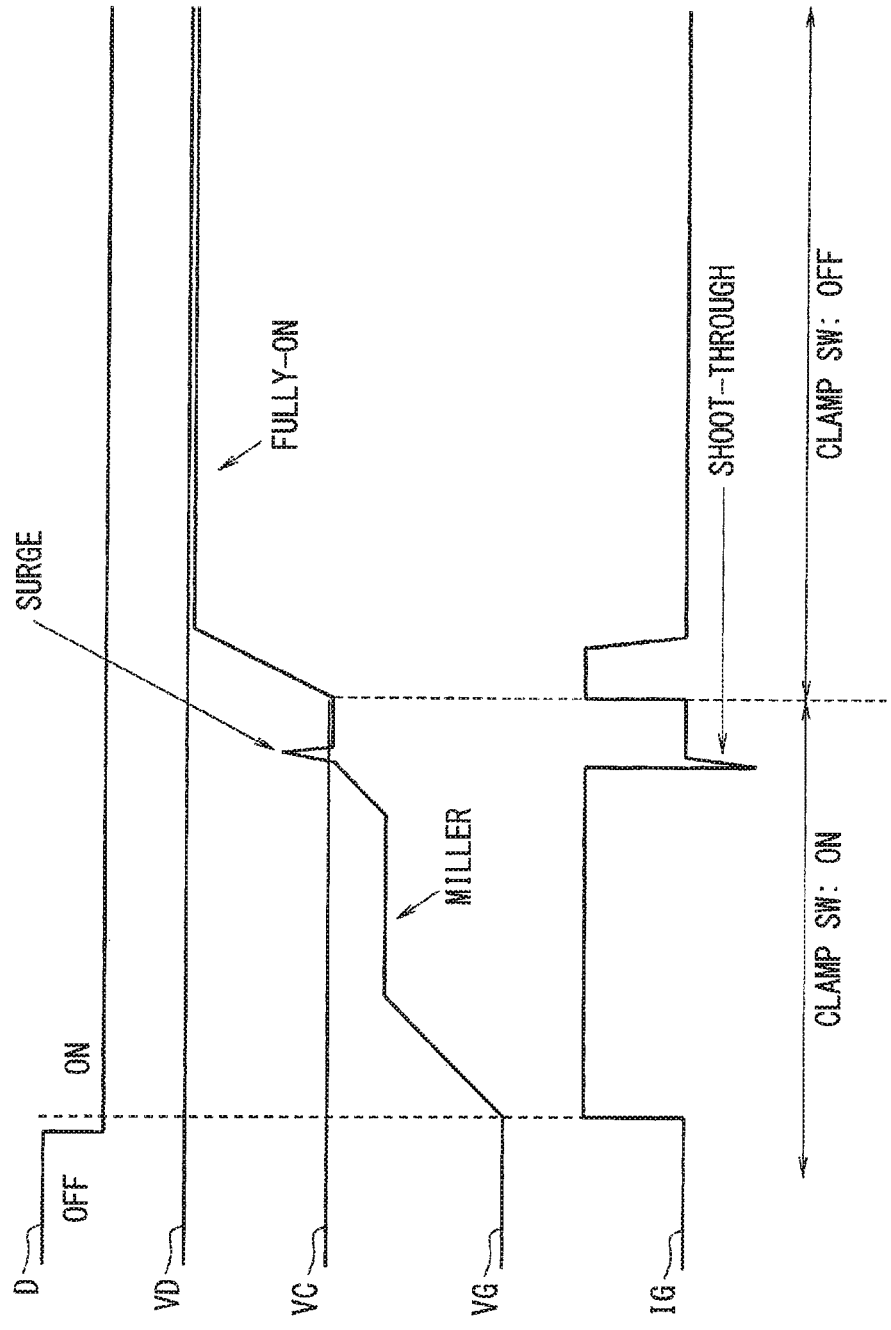

GATE DRIVER

CROSS REFERENCE TO RELATED APPLICATION

This application is based on Japanese Patent Application No. 2014-29605 filed on Feb. 19, 2014, the contents of which are incorporated herein by reference.

FIELD

The present disclosure relates to a gate driver for a transistor.

BACKGROUND

As disclosed in, for example, JP2012-147671A corresponding to US2009/0002054A1, a constant current drive may be employed in a gate driver for driving a gate of a transistor such as an insulated-gate bipolar transistor (IGBT). Compared to a constant voltage drive, the constant current drive has an advantage that a switching loss at the time of the rising is small. As disclosed in, for example, JP10-32476A, a drive circuit may be provided with a clamp circuit for clamping a gate voltage to a predetermined voltage. For example, when an IGBT falls in an overcurrent state, the clamp circuit protects a gate voltage of the IGBT from increasing.

After a deep study, the present inventor has found out that using the constant current drive and the clamp circuit in combination in a gate driver may result in the following problem. Specifically, although a gate drive current decreases with an increase in a gate voltage in the constant voltage drive, a constant gate drive current flows regardless of an increase in a gate voltage in the constant current drive. For this reason, there is a trend that a gate drive current is larger in the constant current drive than in the constant voltage drive.

For example, the clamp circuit has devices including a Zener diode and a MOS transistor. When a gate voltage seeks to increase above a predetermined clamp voltage, the clamp circuit performs a clamp action that clamps the gate voltage to the clamp voltage by drawing a gate drive current to a ground through the devices. In the clamp action, the clamp circuit is required to draw a large amount of the gate drive current in the constant current drive compared to in the constant current drive. Accordingly, a loss in the gate driver increases.

A parasitic inductance component (hereinafter referred to as the "parasitic inductor") derived from a wire and the like exists between the gate driver and the gate of the IGBT. As described above, since the gate drive current is larger in the constant current drive than in the constant voltage drive, a current flowing through the parasitic inductor in a normal state is large accordingly. Therefore, in an abnormal state such as an overcurrent state, the clamp circuit performs a current draw action that draws the entire large gate drive current to the ground. In this case, the current draw action may be excessively performed due to recovery characteristics of the MOS transistor and due to response delay in a gate control circuit. As a result, the current flowing through the parasitic inductor changes largely between a positive value and a negative value. It is noted that the current has a positive value when flowing toward the gate.

At this time, a surge occurs in the gate of the IGBT according to an inductance (L) of the parasitic inductor and a rate of change (di/dt) in the current flowing through the parasitic inductor. The surge is given by the following formula: "$-Lx(di/dt)$". That is, as the current change rate is higher, the surge is larger. Accordingly, compared to in the constant voltage drive, the surge is large in the constant current drive where a relatively large current flows through the parasitic inductor in a normal state.

If the gate voltage increases due to the surge and exceeds a gate breakdown voltage of the IGBT, the IGBT may be broken or reduced in life. If the gate voltage further increases due to the surge, the IGBT is more fully ON (i.e., ON-resistance of the IGBT becomes smaller) despite the overcurrent state. Accordingly, its corrector current further increases, so that the IGBT may be broken.

SUMMARY

In view of the above, it is an object of the present disclosure to provide a gate driver capable of driving a gate of a transistor with a constant current and capable of protecting the transistor from damage caused by an increase in a voltage of the gate, for example, when the transistor is in an overcurrent state.

According to an aspect of the present disclosure, a gate driver for driving a first transistor includes a gate reference voltage generation circuit, a constant current circuit, a second transistor, a drive controller, a voltage change controller, and an overcurrent detector. The gate reference voltage generation circuit outputs a gate reference voltage as a reference for a drive voltage to turn ON the first transistor. The gate reference voltage generation circuit is capable of changing the gate reference voltage to be outputted between at least two values. The constant current circuit supplies a constant current to a gate of the first transistor.

The second transistor is connected in a forward direction in a gate current supply path from an output terminal of the constant current circuit to the gate of the first transistor. The second transistor is an N channel or NPN transistor and has a gate supplied with the gate reference voltage. The drive controller drives the gate of the first transistor with the constant current by operating the constant current circuit when an ON instruction is inputted.

The voltage change controller sets a value of the gate reference voltage to be outputted by the gate reference voltage generation circuit to a first setting value or a second setting value greater than the first setting value. The overcurrent detector determines whether the first transistor is in an overcurrent state where an excessive current greater than a predetermined failure threshold flows in the first transistor.

The voltage change controller sets the value of the gate reference voltage so that the value of the gate reference voltage is the first setting value when the ON instruction is inputted. Then, when a predetermined transition timing comes after a Miller period of the first transistor ends under a condition where the overcurrent detector does not determine that the first transistor is in the overcurrent state, the voltage change controller changes the value of the gate reference voltage from the first setting value to the second setting value.

BRIEF DESCRIPTION OF THE DRAWINGS

The above and other objects, features and advantages of the present disclosure will become more apparent from the following detailed description made with reference to the accompanying drawings. In the drawings:

FIG. 4 is a timing diagram of the gate driver in a normal state;

FIG. 5 is a timing diagram of the gate driver in an abnormal state;

FIG. 7 is a timing diagram of the conventional gate driver in a normal state;

DETAILED DESCRIPTION

Embodiments of the present disclosure are described below with reference to the drawings in which like characters of reference indicate the same or equivalent parts.

First Embodiment

A first embodiment of the present disclosure is described below with reference to FIGS. 1-8.

Figure 1:
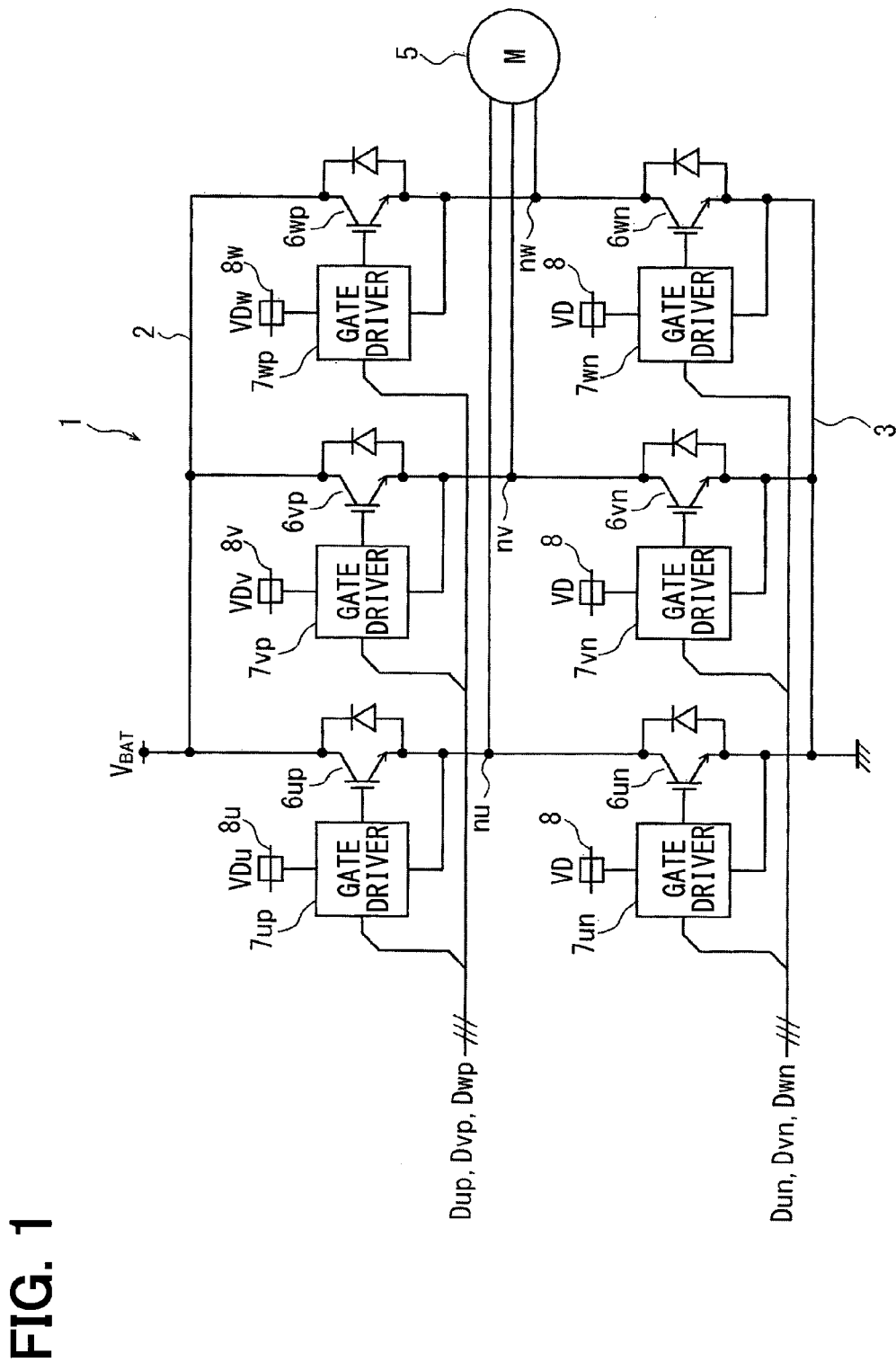
FIG. 1 is a circuit diagram of an inverter apparatus having a gate driver according to a first embodiment of the present disclosure.

An inverter apparatus 1 shown in FIG. 1 is supplied with a direct-current voltage (DC) from a battery mounted on a vehicle through power supply lines 2 and 3 and outputs an alternating-current (AC) voltage to a brushless DC motor 5 in accordance with PWM control signals Dup, Dvp, Dwp, Dun, Dvn, and Dwn received through a photocoupler from a controller 4 (refer to FIG. 2) such as a microcomputer.

Upper-arm IGBTs 6up, 6vp, and 6wp and lower-arm IGBTs 6un, 6vn, 6wn are connected in a three-phase configuration. Each of the IGBTs 6up, 6vp, 6wp, 6un, 6vn, and 6wn is connected in parallel with an individual flyback diode. Each of the IGBTs 6up, 6vp, 6wp, 6un, 6vn, and 6wn has another IGBT for sensing current and is implemented as an individual power module. The IGBTs 6up, 6vp, 6wp, 6un, 6vn, and 6wn are driven by gate drivers 7up, 7vp, 7wp, 7un, 7vn, and 7wn, respectively. Each of the gate drivers 7up, 7vp, 7wp, 7un, 7vn, and 7wn is implemented as an individual integrated circuit (IC).

The gate drivers 7up, 7vp, and 7wp for the upper arm are supplied with power supply voltages VDu, VDv, and VDw through power supply lines 8u, 8v, and 8w, respectively. Output nodes nu, nv, and nw serve as reference potentials for the power supply lines 8u, 8v, and 8w, respectively. Each of the gate drivers 7un, 7vn, and 7wn for the lower arm is supplied with a power supply voltage VD through a power supply line 8. A ground serves as a reference potential for the power supply line 8. Each of the gate drivers 7up, 7vp, 7wp, 7un, 7vn, and 7wn has the same structure. The gate drivers 7up, 7vp, 7wp, 7un, 7vn, and 7wn are hereinafter sometimes referred to collectively as the "gate driver 7". Likewise, the IGBTs 6up, 6vp, 6wp, 6un, 6vn, and 6wn are hereinafter sometimes referred to collectively as the "IGBT 6", and the PWM control signals Dup, Dvp, Dwp, Dun, Dvn, and Dwn are hereinafter sometimes referred to collectively as the "control signal D".

Figure 2:
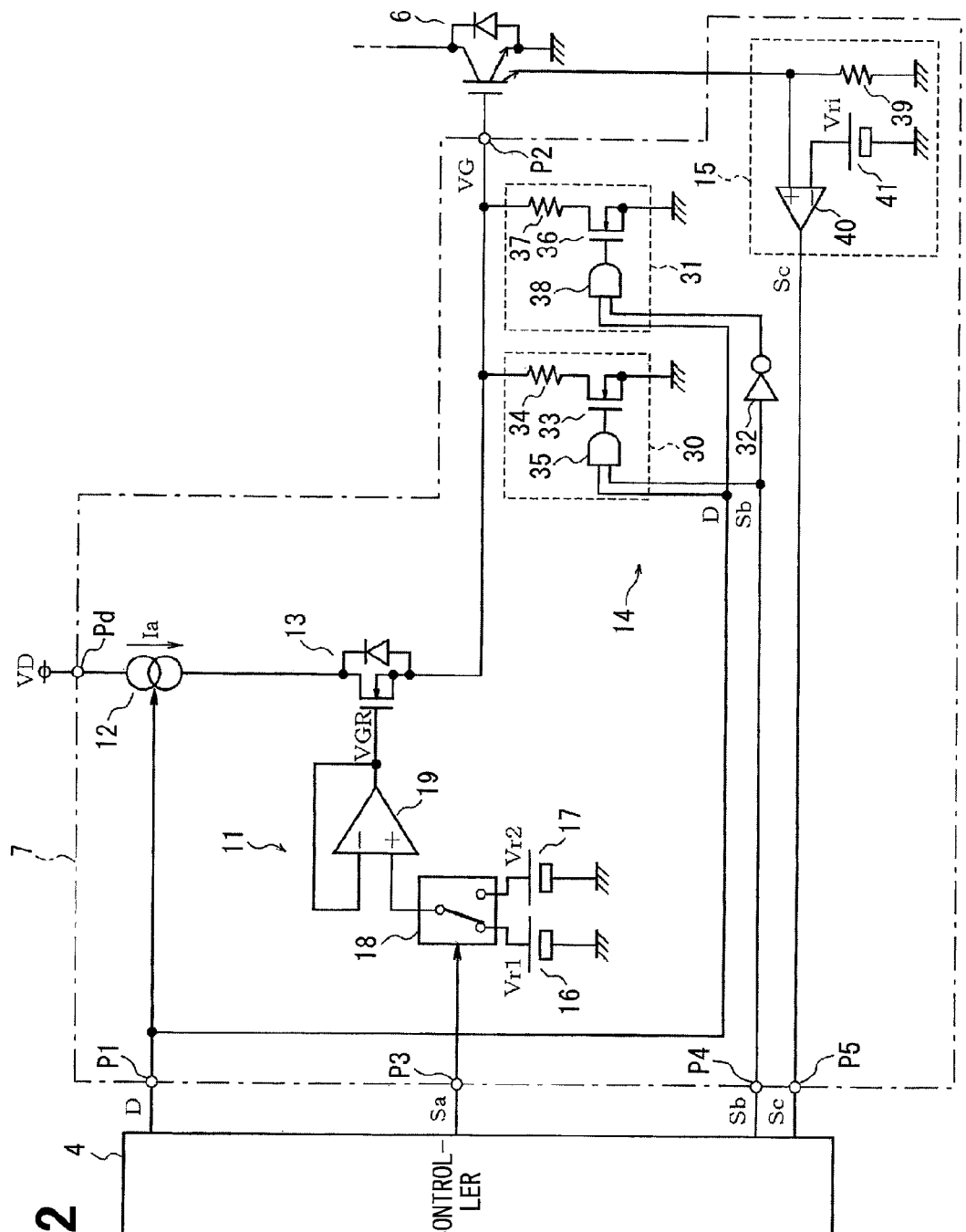
FIG. 2 is a circuit diagram of the gate driver.

As shown in FIG. 2, the gate driver 7 includes a gate reference voltage generation circuit 11, a constant current circuit 12, a voltage output transistor 13, a gate off drive circuit 14, and an overcurrent determination circuit 15. It is noted that the controller 4 corresponds to a drive controller and a voltage change controller recited in claims. The gate driver 7 as an IC has terminals Pd, P1, P2, P3, P4, and P5. The terminal Pd is an input terminal for receiving the power supply voltage VD. The terminal P1 is an input terminal for receiving the control signal D. The terminal P2 is an output terminal for outputting a gate voltage VG. When the control signal D is at a H (high) level, the gate driver 7 receives an OFF instruction to turn OFF the IGBT 6. In contrast, when the control signal D is at a L (low) level, the gate driver 7 receives an ON instruction to turn ON the IGBT 6. The terminal P3 is an input terminal for receiving a voltage change signal Sa. The terminal P4 is an input terminal for receiving an abnormality determination signal Sb. The terminal P5 is an input terminal for receiving an overcurrent determination signal Sc. These signals Sa, Sb, and Sc are described in detail later.

The gate reference voltage generation circuit 11 generates and outputs a gate reference voltage VGR. The gate reference voltage VGR is used as a reference for a drive voltage to turn ON the IGBT 6. The gate reference voltage generation circuit 11 changes the gate reference voltage VGR to be outputted between two values according to a level of the voltage change signal Sa received from the controller 4. Specifically, when the voltage change signal Sa is at a H level, the gate reference voltage generation circuit 11 changes a value of the gate reference voltage VGR to a first setting value VGR1, and when the voltage change signal Sa is at a L level, the gate reference voltage generation circuit 11 change the value of the gate reference voltage VGR to a second setting value VGR2 greater than the first setting value VGR1. The first and second setting values VGR1 and VGR2 are described in detail later.

The gate reference voltage generation circuit 11 includes reference voltage generation circuits 16 and 17, a selector switch 18, and an operational amplifier 19. For example, each of the reference voltage generation circuits 16 and 17 can be a bandgap reference circuit. The reference voltage generation circuit 16 generates a first reference voltage Vr1 corresponding to the first setting value VGR1. The reference voltage generation circuit 17 generates a second reference voltage Vr2 corresponding to the second setting value VGR2.

The first reference voltage Vr1 outputted from the reference voltage generation circuit 16 is supplied to a first selection terminal of the selector switch 18. The second reference voltage Vr2 outputted from the reference voltage generation circuit 17 is supplied to a second selection terminal of the selector switch 18. A common terminal of the selector switch 18 is connected to a non-inverting input terminal of the operational amplifier 19. The selector switch 18 selects one of the first and second selection terminals according to the level of the voltage change signal Sa supplied from the controller 4.

Specifically, when the voltage change signal Sa is at a H level, the selector switch 18 selects the first selection terminal so that the common terminal and the first selection terminal can be electrically connected. Thus, the first reference voltage Vr1 is applied to the non-inverting input terminal of the operational amplifier 19. In contrast, when the voltage change signal Sa is at a L level, the selector switch 18 selects the second selection terminal so that the common terminal and the second selection terminal can be electrically connected. Thus, the second reference voltage Vr2 is applied to the non-inverting input terminal of the operational amplifier 19.

An output terminal and an inverting input terminal of the operational amplifier 19 are connected together so that the operational amplifier 19 can act as a voltage follower. An output voltage (the gate reference voltage VGR) of the operational amplifier 19 can be applied to a gate (i.e., control terminal) of the voltage output transistor 13. The voltage output transistor 13 is an N-channel MOS transistor. The voltage output transistor 13 is connected in a forward direction in a gate current supply path from an output terminal of the constant current circuit 12 to the gate of the IGBT 6. That is, the drain of the voltage output transistor 13 is connected to the output terminal side of the constant current circuit 12, and the source of the voltage output transistor 13 is connected to the terminal P2 side.

The constant current circuit 12 outputs a constant current Ia in a direction from the power supply voltage VD to the gate of the IGBT 6 through the voltage output transistor 13. When the control signal D received from the controller 4 is at a L level, the constant current circuit 12 performs an output action to output the constant current Ia. Thus, the gate capacitance is charged by the constant current Ia outputted from the constant current circuit 12 through the voltage output transistor 13, and the gate voltage VG increases accordingly, so that the IGBT 6 is turned ON. That is, the gate driver 7 turns ON the IGBT 6 by driving the gate of the IGBT 6 with a constant current. At this time, the gate voltage VG of the IGBT 6 increases to a voltage value which is less than the gate reference voltage VGR by a gate threshold voltage Vt of the voltage output transistor 13. In contrast, when the control signal D received from the controller 4 is at a H level, the constant current circuit 12 stops the output action to output the constant current Ia.

Figure 3A:
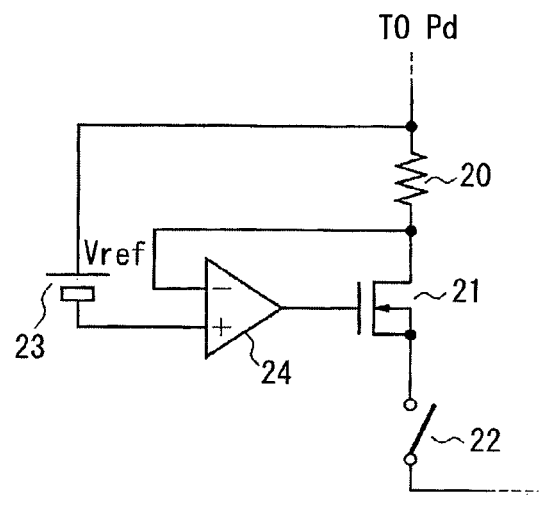
FIG. 3A is a circuit diagram of an example of a constant current circuit of the gate driver.
Figure 3B:
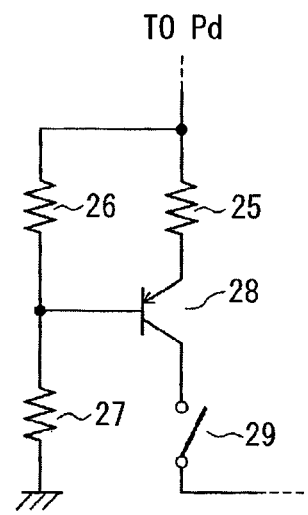
FIG. 3B is a circuit diagram of another example of the constant current circuit.

FIGS. 3A and 3B show examples of a structure of the constant current circuit 12. In the example shown in FIG. 3A, the constant current circuit 12 includes a resistor 20, a P-channel MOS transistor 21, a switch 22, and a reference voltage generation circuit 23, and an operational amplifier 24.

The resistor 20, the transistor 21, and the switch 22 are connected in series between the terminal Pd and the drain of the voltage output transistor 13. A first terminal of the resistor 20 is connected to the terminal Pd, and a second terminal of the resistor 20 is connected to an inverting input terminal of the operational amplifier 24. A high-potential-side terminal of the reference voltage generation circuit 23 is connected to the first terminal of the resistor 20, and a low-potential-side terminal of the reference voltage generation circuit 23 is connected to a non-inverting input terminal of the operational amplifier 24. An output signal of the operational amplifier 24 is supplied to the gate of the transistor 21.

In the example shown in FIG. 3B, the constant current circuit 12 includes resistors 25-27, a PNP bipolar transistor 28, and a switch 29. The resistor 25, the transistor 28, and the switch 29 are connected in series between the terminal Pd and the drain of the voltage output transistor 13. A node between the resistors 26 and 27 is connected to the base of the transistor 28.

The constant current circuit 12 having such structures as shown in FIGS. 3A and 3B can output the constant current Ia when a voltage between its input and output terminals (i.e., a difference between the power supply voltage VD and the drain voltage of the voltage output transistor 13) is not less than its operation guaranteed voltage.

The gate off drive circuit 14 includes a normal-off circuit 30, an abnormal-off circuit 31, and an NOT circuit 32. The normal-off circuit 30 includes a transistor 33, a resistor 34, and an AND circuit 35. The transistor 33 is an N-channel MOS transistor. The drain of the transistor 33 is connected to the gate of the IGBT 6 through the resistor 34. The source of the transistor 33 is connected to the ground. An output signal of the AND circuit 35 is supplied to the gate of the transistor 33. The control signal D is supplied to a first input terminal of the AND circuit 35, and the abnormality determination signal Sb is supplied to a second input terminal of the AND circuit 35.

The abnormal-off circuit 31 includes a transistor 36, a resistor 37, and an AND circuit 38. The transistor 36 is an N-channel MOS transistor. The drain of the transistor 36 is connected to the gate of the IGBT 6 through the resistor 37. The source of the transistor 36 is connected to the ground. An output signal of the AND circuit 38 is supplied to the gate of the transistor 36. The control signal D is supplied to a first input terminal of the AND circuit 38. The abnormality determination signal Sb is inverted by the NOT circuit 32 and then supplied to a second input terminal of the AND circuit 38. A resistance of the resistor 37 of the abnormal-off circuit 31 is greater than a resistance of the resistor 34 of the normal-off circuit 30.

The abnormality determination signal Sb is supplied from the controller 4 and has a level changing depending on whether an overcurrent state occurs in the IGBT 6. Specifically, the abnormality determination signal Sb is at a H level in a normal state where the overcurrent state does not occurs in the IGBT 6. In contrast, the abnormality determination signal Sb is at a L level in an abnormal state where the overcurrent state occurs in the IGBT 6.

According to the above structure, when both the control signal D and the abnormality determination signal Sb are at a H level, i.e., when the gate driver 7 receives the OFF instruction to turn OFF the IGBT 6 in the normal state, a conduction path extending from the gate of the IGBT 6 to the ground (i.e., the emitter of the IGBT 6) through the normal-off circuit 30 is formed. Thus, the gate capacitance is discharged with a time constant determined by the resistance of the resistor 34 which is relatively small. Therefore, in the normal state, when the gate driver 7 receives the OFF instruction to turn OFF the IGBT 6, the gate voltage decreases sharply so that the IGBT 6 can be turned OFF sharply.

In contrast, when the control signal D is at a H level, but the abnormality determination signal Sb is at a L level, i.e., when the gate driver 7 receives the OFF instruction to turn OFF the IGBT 6 in the abnormal state, a conduction path extending from the gate of the IGBT 6 to the ground (i.e., the emitter of the IGBT 6) through the abnormal-off circuit 31 is formed. Thus, the gate capacitance is discharged with a time constant determined by the resistance of the resistor 37 which is relatively large. Therefore, in the abnormal state, when the gate driver 7 receives the OFF instruction to turn OFF the IGBT 6, the gate voltage decreases sharply so that the IGBT 6 can be turned OFF slowly.

The overcurrent determination circuit 15 (corresponding to an overcurrent detector recited in claims) makes a determination of whether the IGBT 6 suffers from the overcurrent state where a current greater than a failure threshold (i.e., overcurrent threshold) flows in the IGBT 6. The overcurrent determination circuit 15 outputs to the controller 4 the overcurrent determination signal Sc indicative of a result of the determination. The overcurrent determination signal Sc is at a L level, when the current greater than the failure threshold does not flow in the IGBT 6. In contrast, the overcurrent determination signal Sc is at a H level when the current greater than the failure threshold flows in the IGBT 6.

The overcurrent determination circuit 15 includes a resistor 39, a comparator 40, and a reference voltage generator 41. The resistor 39 is connected between a current sensing emitter of the IGBT 6 and the ground. A voltage at a node between the resistor 39 and the current sensing emitter, i.e., a voltage drop across the resistor 39 with respect to the ground generated when a current flowing through the current sensing emitter flows through the resistor 39 is applied to a non-inverting input terminal of the comparator 40.

The reference voltage generator 41 has a constant voltage circuit for generating a reference voltage Vri with respect to the ground. The reference voltage Vri generated by the reference voltage generator 41 is applied to an inverting input terminal of the comparator 40. An output signal of the comparator 40 is supplied as the overcurrent determination signal Sc to the controller 4.

The first setting value VGR1 is set to satisfy the following two conditions: The gate voltage VG is larger than a Miller voltage, and the current flowing in the IGBT 6 is not greater than a maximum allowable current. It is noted that the maximum allowable current is a value specific to the IGBT 6 and the maximum value capable of flowing in the IGBT 6 without a breakdown of the IGBT 6. The second setting value VGR2 is set to satisfy the following two conditions: The gate voltage VG of the IGBT 6 is equal to or smaller than a voltage that does not degrade a gate oxide film, and a loss at the time of a fully-ON operation of the IGBT 6 is smaller than a predetermined value.

Next, operations of the gate driver 7 to turn ON the IGBT 6 are described below with reference to FIGS. 4 and 5. FIG. 4 shows simplified waveforms of the control signal D, the power supply voltage VD, the gate reference voltage VGR, the gate voltage VG, and a gate current IG to charge the gate capacitance in the normal state. FIG. 5 shows simplified waveforms of the control signal D, the power supply voltage VD, the gate reference voltage VGR, the gate voltage VG, and the gate current IG in the abnormal state.

When the control signal D changes from a H level for turning OFF the IGBT 6 to a L level for turning ON the IGBT 6 at a time t1, the constant current circuit 12 outputs the constant current Ia. Accordingly, the gate capacitance starts to be charged, and the gate voltage VG starts to increase at a time t2. It is noted that the controller 4 sets the voltage change signal Sa to a H level at or prior to the time t1. Thus, the gate reference voltage generation circuit 11 switches to a first mode where it is capable of outputting the gate reference voltage VGR with the first setting value VGR1. As shown in FIG. 4, due to operations of the constant current circuit 12 or the like, there is a delay in time between when the gate driver 7 receives the ON instruction to turn ON the IGBT 6 at the time t1 and when the gate voltage VG actually starts to increase at the time t2.

Then, when the gate voltage VG reaches a threshold voltage of the IGBT 6, the IGBT 6 is turned ON. When the IGBT 6 is turned ON, a Miller period (i.e., Miller region) starts at a time t3 and ends at a time t4. The gate voltage VG is kept at the Miller voltage during the Miller period. When the Miller period ends, the gate voltage VG starts to increase again.

"T1" from the time t1 to the time t5 in FIG. 4 represents a first period necessary to determine a presence or absence of a short-circuit failure while limiting a current flowing through the IGBT 6 to a safe value not greater than the maximum allowable current of the IGBT 6. The short-circuit failure may occur in another IGBT 6 (e.g., IGBT 6*up*) which forms a bridge circuit with the IGBT 6 (e.g., IGBT 6*un*), the output node nx (x: u, v, w), and a winding of the motor 5.

The controller 4 determines whether the short-circuit failure occurs based on the overcurrent determination signal Sc supplied from the overcurrent determination circuit 15. That is, the controller 4 determines whether the collector current of the IGBT 6 is greater than the failure threshold. The failure threshold is set to a value greater than the maximum current capable of flowing in the IGBT 6 when the short-circuit failure does not occur and smaller than a current (not greater than the maximum allowable current) flowing in the IGBT 6 when the short-circuit failure occurs.

For example, as shown in FIG. 5, when the short-circuit failure occurs in the other IGBT 6 which forms the bridge circuit with the IGBT 6, and the current of the IGBT 6 reaches the failure threshold, the overcurrent determination signal Sc changes to a H level at a time ta. In this case, the controller 4 determines that the collector current of the IGBT 6 is greater than the failure threshold. Accordingly, the transistor 36 of the abnormal-off circuit 31 of the gate off drive circuit 14 is turned ON, so that the IGBT6 is turned OFF slowly. It is noted that since the short-circuit failure occurs in the other IGBT 6, a gate-collector voltage of the IGBT 6 is maintained unchanged almost at a DC voltage VBAT. For the reason, as shown in FIG. 5, there is no Miller period, so that the gate voltage VG increases almost linearly.

In the first period T1, the gate reference voltage generation circuit 11 is in the first mode where it is capable of outputting the gate reference voltage VGR with the first setting value VGR1. Thus, in the first period T1, the IGBT 6 is turned ON and operates in active region. In the first period T1, the gate voltage VG increases to a value which is less than the first setting value VGR1 by the gate threshold voltage Vt of the voltage output transistor 13. Further, in the first period, even when there exists a state (i.e., overcurrent state) where an excessive short-circuit current can flow due to the short-circuit failure or the like, the gate voltage VG is limited to or below the above voltage (=VGR1−Vt). Thus, a peak value of the short-circuit current (i.e., collector current) can be reduced.

A second period T2 (after the time t5) starts when the first period T1 ends and it is determined that there is no short-circuit failure. In the second period T2, to reduce loss, the gate voltage VG needs to be high enough to turn ON the IGBT 6 in saturation region. However, when the gate voltage VG applied to the IGBT 6 is greater than the gate breakdown voltage of the IGBT 6, the IGBT 6 may break down.

For this reason, when the second period T2 starts, the controller 4 sets the voltage change signal Sa to a L level. Thus, the gate reference voltage generation circuit 11 switches to a second mode where it is capable of outputting the gate reference voltage VGR with the second setting value VGR2. Therefore, in the second period T2, the gate voltage VG increases to a value which is less than the second setting value VGR2 by the gate threshold voltage Vt of the voltage output transistor 13 so that the IGBT 6 can be turned ON (i.e., fully ON) and operate in saturation region. Further, in the second period T2, even when there exists a state (i.e., overcurrent state) where an excessive short-circuit current can flow due to the short-circuit failure or the like, the gate voltage VG is limited to or below the above voltage (=VGR2−Vt). Thus, a peak value of the short-circuit current (i.e., collector current) can be reduced.

Although not shown in FIG. 4, when the control signal D changes from a L level (ON instruction) to a H level (OFF instruction), the transistor 33 of the normal-off circuit 30 of the gate off drive circuit 14 is turned ON, and the IGBT 6 is turned OFF sharply.

In the above structure, the time at which the first period T1 ends, i.e., a transition timing at which a transition occurs from the first period T1 to the second period T2 should be determined in consideration of values (e.g., the threshold voltage and the length of the Miller period) specific to the IGBT 6 to be driven. For example, the transition timing can be determined by the following two methods. In the first method, the transition timing is set to when a predetermined period of time elapses after the time (i.e., time t1) at which the control signal D changes to a L level. In the second method, an additional gate voltage detection circuit for detecting the gate voltage VG is added, and the transition timing is set to when a predetermined period of time elapses after a value detected by the gate voltage detection circuit reaches a predetermined threshold which is greater than the gate voltage VG when the IGBT 6 is OFF and less than the Miller voltage.

According to the first method, there is no need to add an additional gate voltage detection circuit for detecting the gate voltage VG, the circuit structure can be simplified. However, in the first method, the predetermined period of time should be set in consideration of a delay in time between when the ON instruction is received (i.e., time t1) and when the gate voltage VG actually starts to increase (i.e., time t2). On the other hand, according to the second embodiment, there is no need to consider the delay in time between when the ON instruction is received and when the gate voltage VG actually starts to increase. However, the second method requires an additional gate voltage detection circuit for detecting the gate voltage VG.

As described above, in the gate driver 7 according to the first embodiment, even when the IGBT 6 falls in the overcurrent state, the gate voltage VG is limited to or below a voltage (=VGR1−Vt) determined by the first setting value VGR1 or a voltage (=VGR2−Vt). This voltage limiting action is achieved by the voltage clamping action of the voltage output transistor 13 connected in a forward direction in the gate current supply path. That is, according to the first embodiment, an increase in the gate voltage VG in the abnormal state is reduced while controlling the gate voltage VG at the time of turn-ON in two stages without drawing the gate current IG to the ground like in the conventional technique. Thus, according to the first embodiment, as described below with reference to FIGS. 6, 7, and 8, the following problems residing in the conventional technique using the clamp circuit can be overcome.

Figure 6:
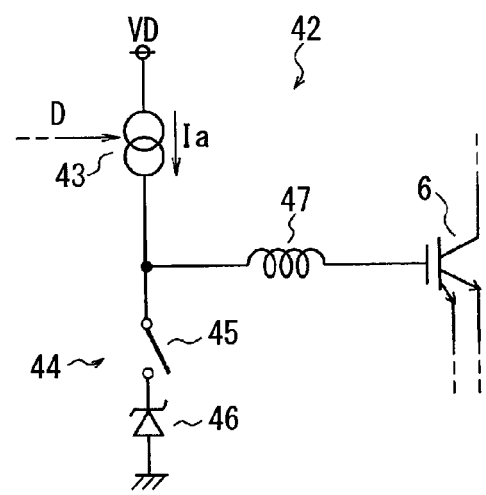
FIG. 6 is a circuit diagram of a conventional gate driver.
Figure 8:
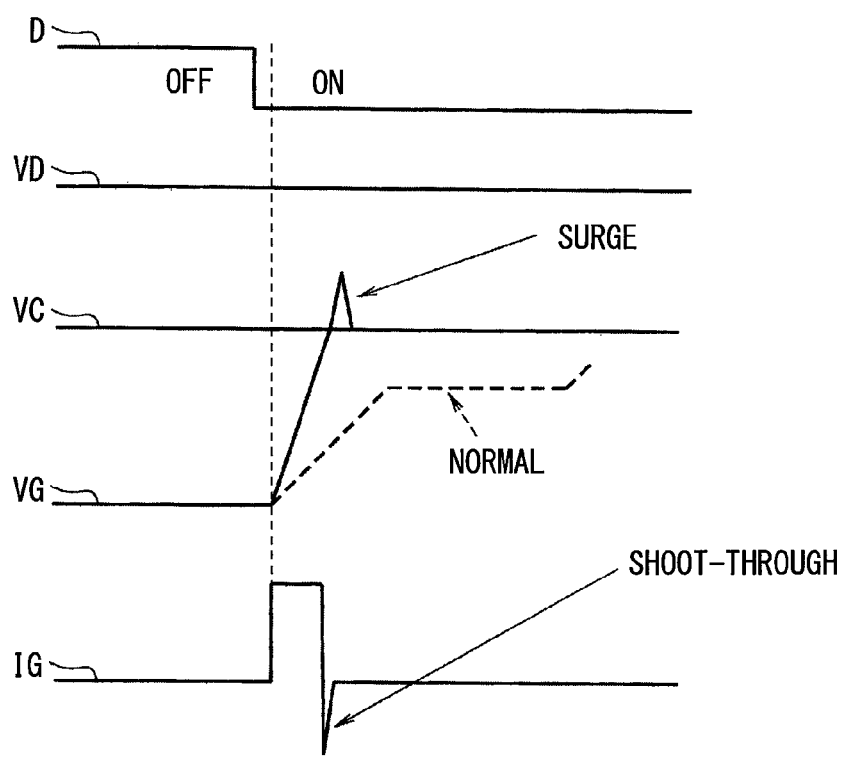
FIG. 8 is a timing diagram of the conventional gate driver in an abnormal state.

FIG. 6 shows an example of a structure of the conventional technique which uses the constant current drive and the clamp circuit in combination. A gate driver 42 shown in FIG. 6 includes a constant current circuit 43 and a clamp circuit 44. The constant current circuit 43 has the same function as the constant current circuit 12 of the first embodiment. The clamp circuit 44 is connected to an output terminal of the constant current circuit 43 and a ground. The clamp circuit 44 is a series circuit of a clamp control switch 45 and a Zener diode 46. As shown in FIG. 6, a parasitic inductor 47 exists in a gate current supply path.

In the gate driver 42 having such a structure, when the clamp control switch 45 is turned ON, a limiting action to limit the gate voltage VG to a clamp voltage VC is performed. Therefore, even in the gate driver 42, like in the first embodiment, an increase in the gate voltage VG in the abnormal state may be reduced (refer to FIG. 8) while controlling the gate voltage VG at the time of turn-ON in two stages (refer to FIG. 7).

However, in the gate driver 42, when the clamp control switch 45 is turned ON so that the clamp circuit 44 performs a current drawing action, a current flowing through the parasitic inductor 47 changes largely between a positive value and a negative value. It is noted that the current flowing through the parasitic inductor 47 has a positive value when flowing toward the gate and has a negative value when flowing toward the clamp circuit 44. Accordingly, a surge occurring at the gate of the IGBT 6 becomes large. It is noted that in FIGS. 7 and 8, the current flowing through the parasitic inductor 47 and having a negative value is denoted as a shoot-through current. This type of problem occurs not only in the abnormal state (where the short-circuit protection is performed) shown in FIG. 8 but also in the normal state (where the gate voltage VG is changed) shown in FIG. 7.

Although not shown in the drawings, even in the structure of the first embodiment, a parasitic inductor, which is formed by board wiring and bonding wires and leads of the power module in which the IGBT 6 is incorporated, exists between the source of the voltage output transistor 13 and the gate of the IGBT 6. In the normal state, a current flows from the voltage output transistor 13 to the gate through the parasitic inductor. However, according to the first embodiment, the limiting action to limit the gate voltage VG is performed without drawing the gate current IG to the ground. Thus, the current flowing through the parasitic inductor changes from a positive value to almost zero without reaching to a negative value.

Therefore, in the structure of the first embodiment, a rate of change (di/dt) in the current flowing through the parasitic inductor can be small compared to that in the conventional structure using the clamp circuit. Accordingly, the surge occurring at the gate of the IGBT 6 is reduced, so that the problem caused by the surge is less likely to occur. In this way, according to the first embodiment, the IGBT 6 can be suitably protected from the increase in the gate voltage VG occurring when the IGBT 6 falls in the overcurrent state, while driving the gate of the IGBT 6 by a constant current.

According to the first embodiment, the voltage output transistor 13 is located on the downstream side of the constant current circuit 12 (i.e., the gate side of the IGBT 6) for the following reasons. Even in a structure (hereinafter referred to as the "comparison example") where the voltage output transistor 13 is located on the upstream side of the constant current circuit 12 (i.e., the power supply voltage VD side), like in the first embodiment, the increase in the gate voltage VG in the abnormal state may be reduced while controlling the gate voltage VG at the time of turn-ON in two stages.

However, in the comparison example, the gate reference voltage VGR needs to be large when ensuring a guaranteed operating voltage for the constant current circuit 12 by increasing a voltage between input and output terminals of the constant current circuit 12. However, since the limit value of the gate voltage VG depends on the gate reference voltage VGR, it is undesirable to unnecessarily increase the gate reference voltage VGR. Therefore, the comparison example has a low degree of freedom to set the guaranteed operating voltage for the constant current circuit 12.

In contrast, according to the first embodiment, the guaranteed operating voltage for the constant current circuit 12 can be ensured by setting the power supply voltage VD so that the voltage between the input and output terminals of the constant current circuit 12 can be increased to a desired value. It is noted that the power supply voltage VD exerts no influence on the limit value of the gate voltage VG. That is, according to the first embodiment, ensuring the guaranteed operating voltage for the constant current circuit 12 and setting the limit value of the gate voltage VG can be performed independently of each other. Thus, the first embodiment has a high degree of freedom to set the guaranteed operating voltage for the constant current circuit 12.

Further, in the abnormal state where the short-circuit failure occurs, the transistor 36 of the abnormal-off circuit 31 of the gate off drive circuit 14 is turned ON so that the gate capacitance can be discharged with a time constant determined by the resistance of the resistor 37 which is relatively large. Thus, the rate (i.e., di/dt) of the change in the collector current (i.e., short-circuit current) is kept low so that the IGBT 6 can be turned OFF slowly. Therefore, a surge exceeding the breakdown voltage of the IGBT 6 can be prevented from occurring.

Second Embodiment

A second embodiment of the present disclosure is described below with reference to FIG. 9.

Figure 9:
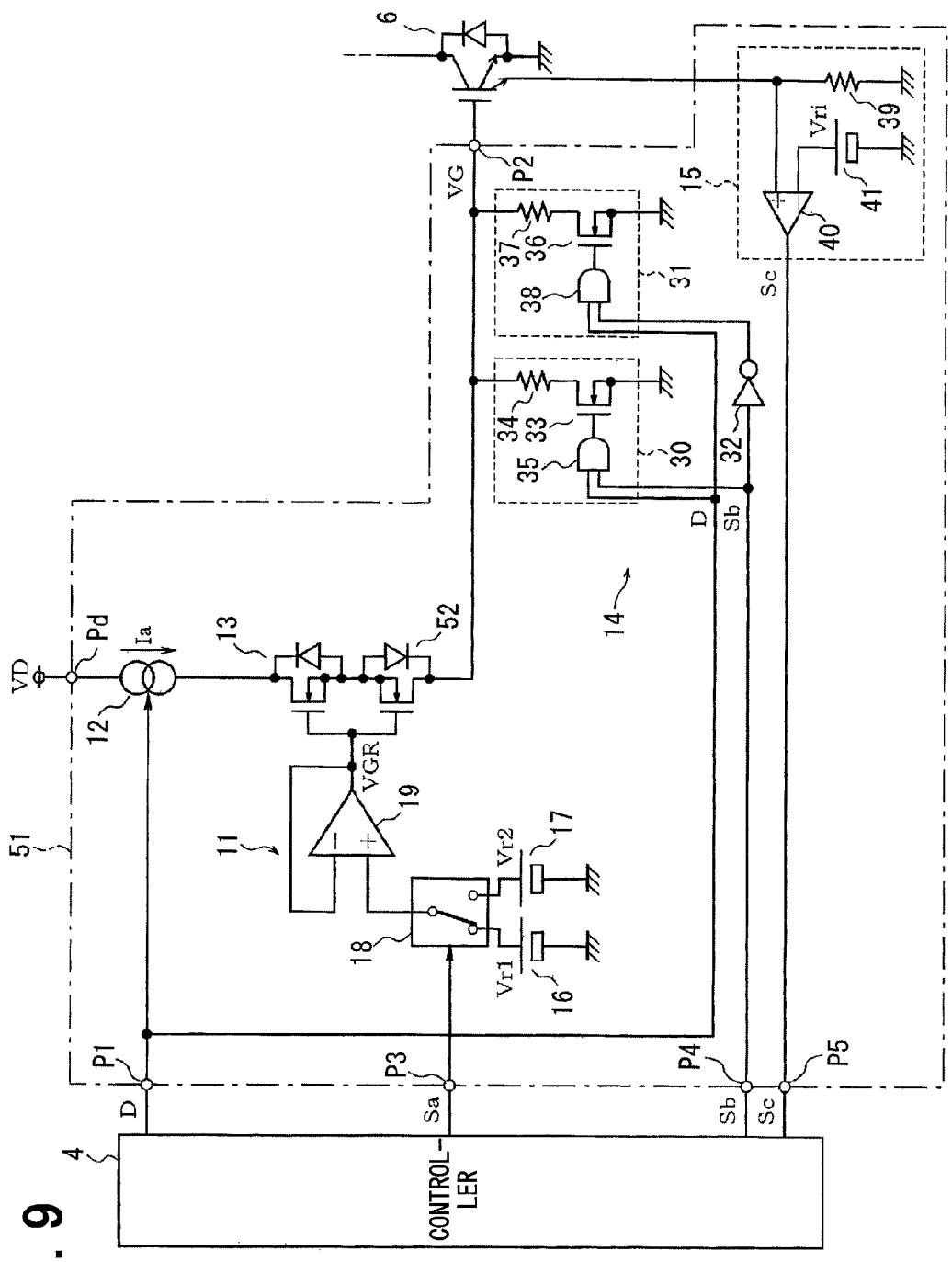
FIG. 9 is a circuit diagram of a gate driver according to a second embodiment of the present disclosure.

As shown in FIG. 9, a gate driver 51 of the second embodiment differs from the gate driver 7 of the first embodiment in that the gate driver 51 has a backflow prevention transistor 52. The backflow prevention transistor 52 is an N-channel MOS transistor and corresponds to a backflow preventer recited in claims. The gate reference voltage VGR is supplied to the gate (i.e., control terminal) of the backflow prevention transistor 52. The source of the voltage output transistor 13 is connected to the source of the backflow prevention transistor 52. The drain of the backflow prevention transistor 52 is connected to the terminal P2. That is, the backflow prevention transistor 52 is connected in a reverse direction in the gate current supply path.

Even in such a structure, the gate voltage VG of the IGBT 6 is limited to or below a voltage determined by the gate reference voltage VGR. A limit value of the gate voltage VG is given by the following equation (1), where Vt represents a gate threshold voltage of the transistor 13, and Ron represents an ON-resistance of the backflow prevention transistor 52: A limit value of the gate voltage $$VG=VGR-Vt-Ron\cdot Ia \quad (1)$$

Since the third term "Ron·Ia" on the right side of the equation (1) is expected to become a sufficiently small value, the limit value of the gate voltage VG of the second embodiment is almost equal to that of the first embodiment. For this reason, the same effect and advantage as obtained in the first embodiment can be obtained in the second embodiment.

In the structure of the first embodiment, when a surge greater than the power supply voltage VD of the gate driver 7 is applied to a gate wire (i.e., a path from the source of the voltage output transistor 13 to the gate of the IGBT 6) due to influence of, for example, switching noise in the inverter apparatus 1, the gate voltage VG may be increased to a value satisfying the following formula (2):

$$VG \geq VD+Vf+V\alpha \quad (2)$$

In this case, a current is drawn from the gate of the IGBT 6 toward the terminal Pd, i.e., a backflow of current to the power source occurs.

In the formula (2), Vf represents a forward voltage of a body diode of the voltage output transistor 13, and Vα represents a voltage between the input and output terminals of the constant current circuit 12 capable of causing the backflow. When the constant current circuit 12 has the structure shown in FIG. 3A, the voltage Vα is equal to a forward voltage of a body diode of the transistor 21, and when the constant current circuit 12 has the structure shown in FIG. 3B, the voltage Vα is almost zero.

When a current draw action that draws the current from the gate of the IGBT 6 toward the terminal Pd (i.e., the power supply voltage VD) occurs, the rate of the change in the current flowing through the parasitic inductor increases in the same manner as when the current draw action that draws the current from the gate of the IGBT 6 toward the ground. As a result, a large surge occurs at the gate of the IGBT 6, and the IGBT 6 may be broken or reduced in life by the surge. However, in the structure of the second embodiment, even when the surge greater than the power supply voltage VD is applied to the gate wire, and the gate voltage VG is increased to the value satisfying the formula (2), a body diode of the backflow prevention transistor 52 prevents the current from being drawn from the gate toward the terminal Pd. Thus, even when the gate voltage VG is raised by noise or the like, the backflow to the power source side is prevented so that problems caused by the backflow can be prevented from occurring.

Third Embodiment

A third embodiment of the present disclosure is described below with reference to FIG. 10.

Figure 10:
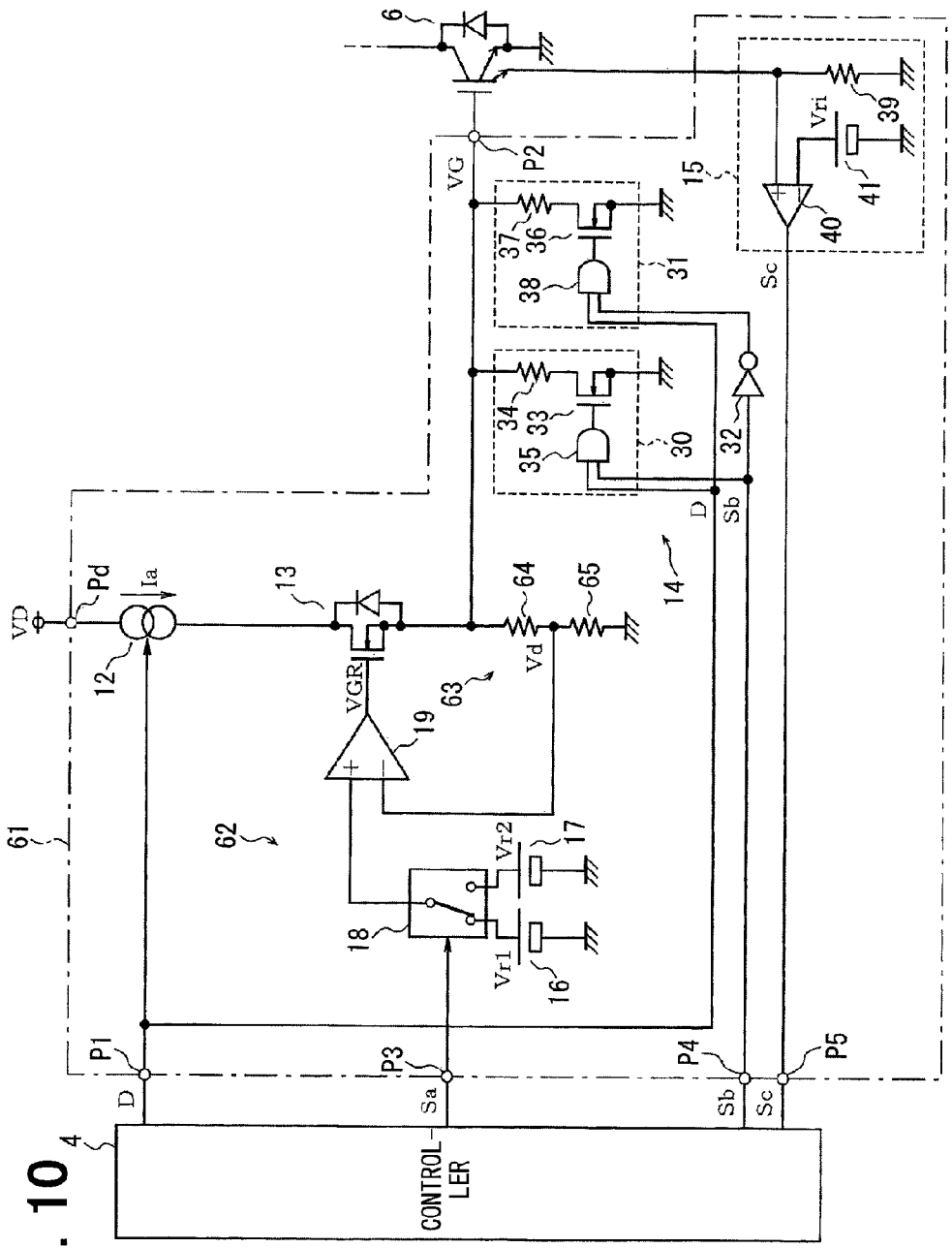
FIG. 10 is a circuit diagram of a gate driver according to a third embodiment of the present disclosure.

As shown in FIG. 10, a gate driver 61 of the third embodiment differs from the gate driver 7 of the first embodiment in that the gate driver 61 has a gate reference voltage generation circuit 62 instead of the gate reference voltage generation circuit 11. The gate reference voltage generation circuit 62 includes a voltage detection circuit 63 for detecting the gate voltage VG.

The voltage detection circuit 53 is a series circuit of resistors 64 and 65 connected between the terminal P2 and the ground. A voltage Vd of a node between the resistors 64 and 65 is applied to the inverting input terminal of the operational amplifier 19. A voltage of the common terminal of the selector switch 18 is applied to the non-inverting input terminal of the operational amplifier 19. Thus, the gate reference voltage generation circuit 62 performs a feedback control of the gate reference voltage VGR to be outputted (i.e., voltage feedback control) so that the gate voltage VG of the IGBT 6 can be equal to a target voltage determined by the first reference voltage Vr1 or the second reference voltage Vr2.

The same effect and advantage as obtained in the first embodiment can be obtained in the third embodiment. Further, the third embodiment can provide the following advantage. In the first and second embodiments, the gate voltage VG depends on the gate threshold voltage Vt of the voltage output transistor 13. Therefore, if the gate threshold voltage Vt varies, the limit value of the gate voltage VG varies accordingly. In contrast, in the third embodiment, the gate voltage VG is kept constant by the voltage feedback control regardless of whether the gate threshold voltage Vt varies. Thus, the gate voltage VG can be controlled accurately.

Fourth Embodiment

A fourth embodiment of the present disclosure is described below with reference to FIG. 11.

Figure 11:
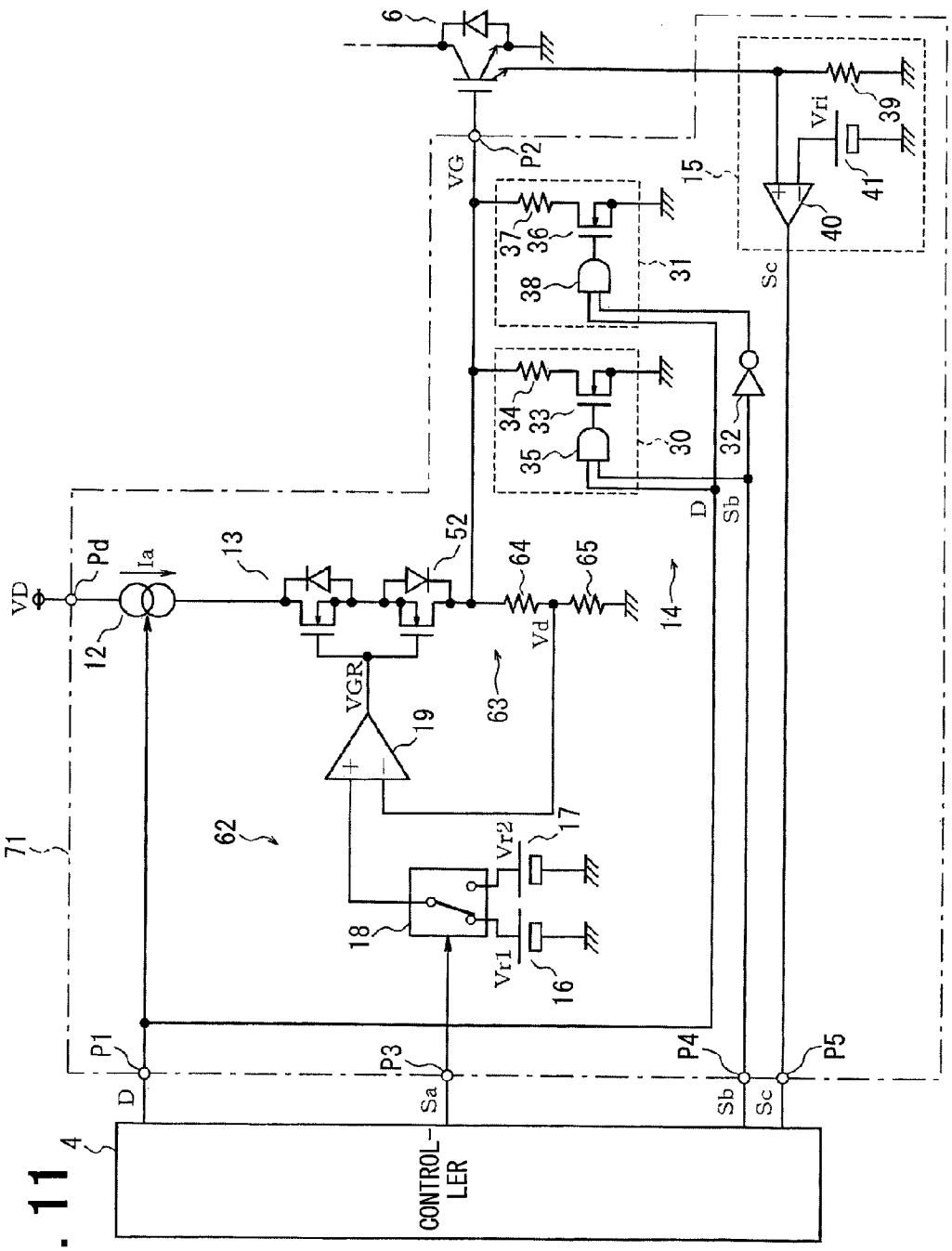
FIG. 11 is a circuit diagram of a gate driver according to a fourth embodiment of the present disclosure.

As shown in FIG. 11, a gate driver 71 of the third embodiment is configured as a combination of the gate driver 51 of the second embodiment and the gate driver 61 of the third embodiment. That is, the gate driver 71 has the backflow prevention transistor 52 connected in a reverse direction in the gate current supply path and the gate reference voltage generation circuit 62 for performing the voltage feedback control.

Thus, like in the second embodiment, even when the gate voltage VG is raised by noise or the like, the backflow to the power source side is prevented so that problems caused by the backflow can be prevented from occurring. Further, like in the third embodiment, the gate voltage VG can be controlled accurately.

Fifth Embodiment

A fifth embodiment of the present disclosure is described below with reference to FIGS. 12 and 13.

Figure 12:
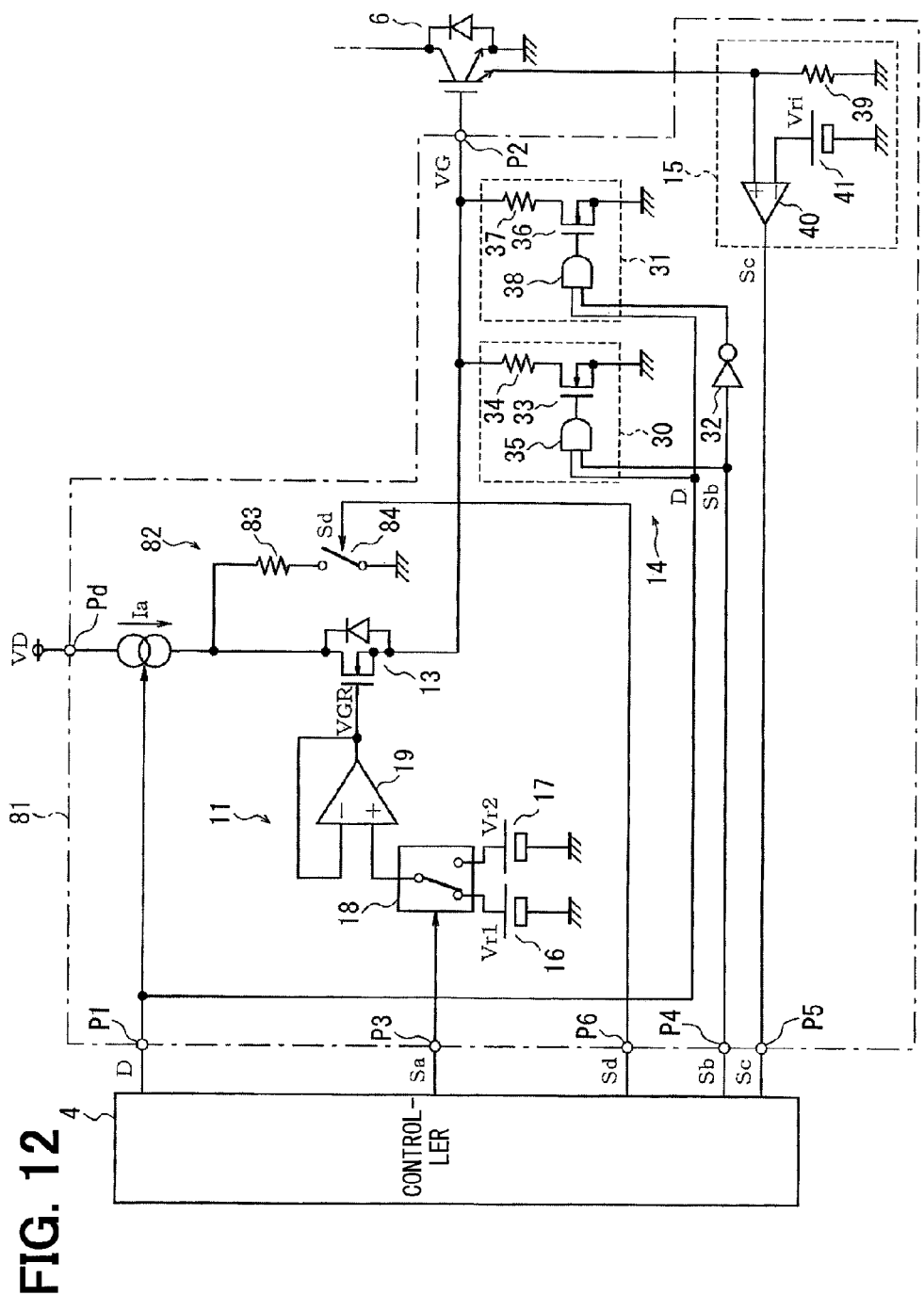
FIG. 12 is a circuit diagram of a gate driver according to a fifth embodiment of the present disclosure.
Figure 13:
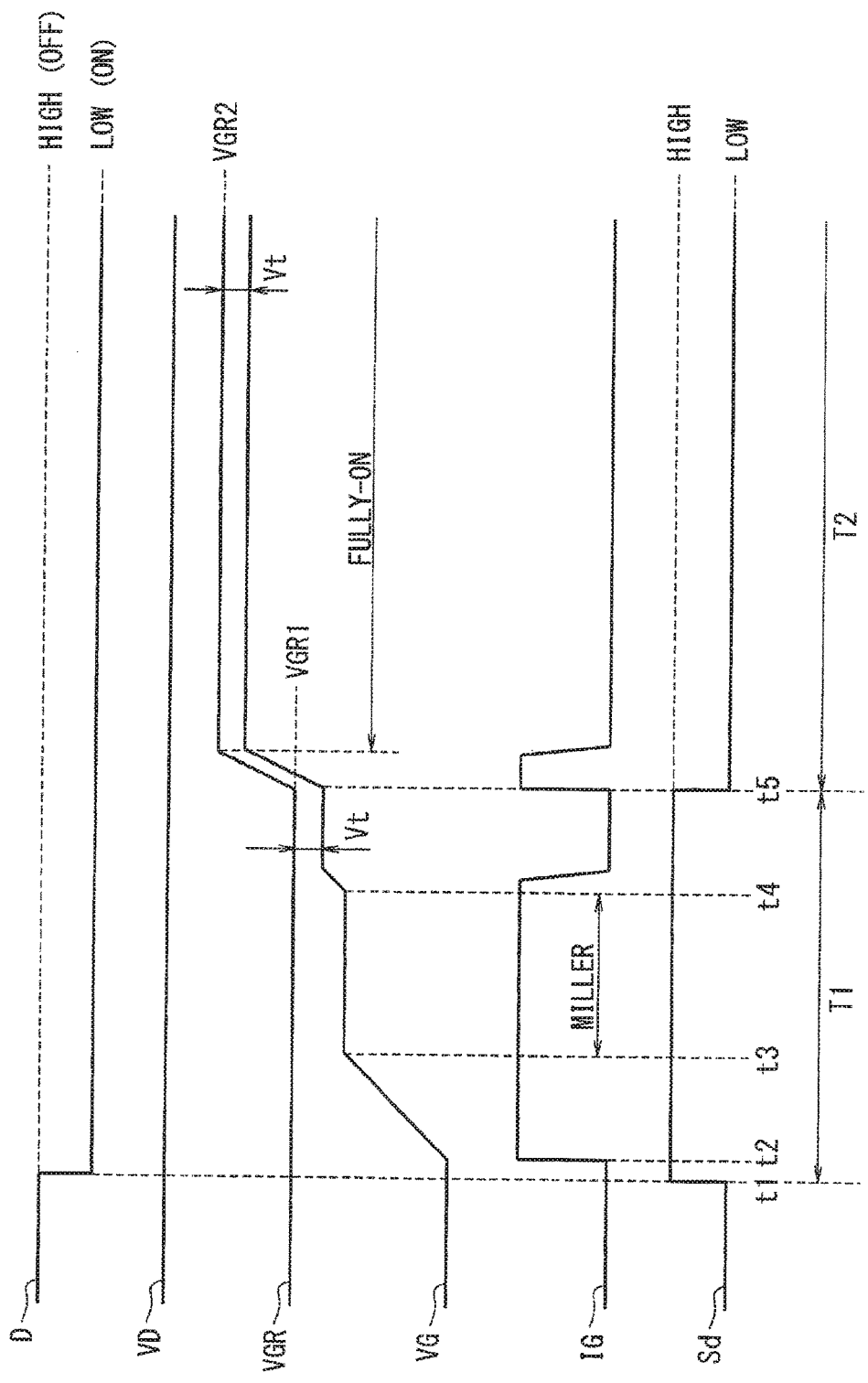
FIG. 13 is a timing diagram of the gate driver of FIG. 12 in a normal state.

As shown in FIG. 12, a gate driver 81 according to the fifth embodiment differs from the gate driver 7 according to the first embodiment in that the gate driver 81 has a current bypass circuit 82. The current bypass circuit 82 is a series circuit of a resistor 83 and a switch 84 connected between the output terminal of the constant current circuit 12 and the ground. The switch 84 is closed and opened (i.e., turned ON and OFF) in accordance with a current path control signal Sd which is supplied from the controller 4 through a terminal P6.

The switch 84 is turned ON when the current path control signal Sd is at a H level. When the switch 84 is tuned ON, a current bypass path from the output terminal of the constant current circuit 12 to the ground appears. Thus, the number of paths through which an output current of the constant current circuit 12 can flow is increased to two: the gate current supply path and the current bypass path which is different from the gate current supply path. In contrast, the switch 84 is turned OFF when the current path control signal Sd is at a L level. When the switch 84 is tuned OFF, the current bypass path disappears.

In the preceding embodiments, when the gate voltage VG reaches its limit value (i.e., VGR1−Vt or VGR2−Vt), the voltage output transistor 13 falls in an almost OFF state, and accordingly the constant current circuit 12 falls in an OFF state (saturated state) where the constant current circuit 12 cannot output the current Ia. When the constant current circuit 12 falls in a complete OFF state once, the constant current circuit 12 cannot output the current immediately even after the voltage output transistor 13 is turned ON again. That is, a delay in the current output action occurs. As a result, deterioration in characteristics may occur, in particular, when the transition occurs from the first period T1 to the second period T2.

Based on the above study, according to the fifth embodiment, the current bypath circuit 82 operates as follows to prevent the constant current circuit 12 from falling in the complete OFF state. As shown in FIG. 13, the controller 4 keeps the current path control signal Sd at a H level in the first period T1, and keeps the current path control signal Sd at a L level in a period other than the first period T1. Thus, the current bypass path is formed in the first period T1, and the current bypass path is not formed in the period other than the first period T1.

In such an approach, even after the gate voltage VG reaches the limit value (i.e., VGR1−Vt) in the first period T1, the constant current circuit 12 can continue to output the current through the current bypass and does not fall in the complete OFF state. Thus, when the limit value of the gate voltage VG changes after the second period T2 starts, the constant current circuit 12 can output the current Ia through the gate current supply path. Therefore, the characteristics can be kept good when the transition occurs from the first period T1 to the second period T2.

As described above, the current bypass path is formed in the first period T1, i.e., in a period from when the ON instruction is inputted to when the transition occurs. A reason for this is that the constant current circuit 12 needs to have a higher responsiveness in the first period T1 than in the second period T2. The constant current circuit 12 does not need to have a high responsiveness in the second period T2 compared to in the first period T1. Therefore, in order to reduce an increase in consumption current caused by a current flowing through the current bypass path, the current bypass path is not formed in the second period T2.

Sixth Embodiment

Figure 15:
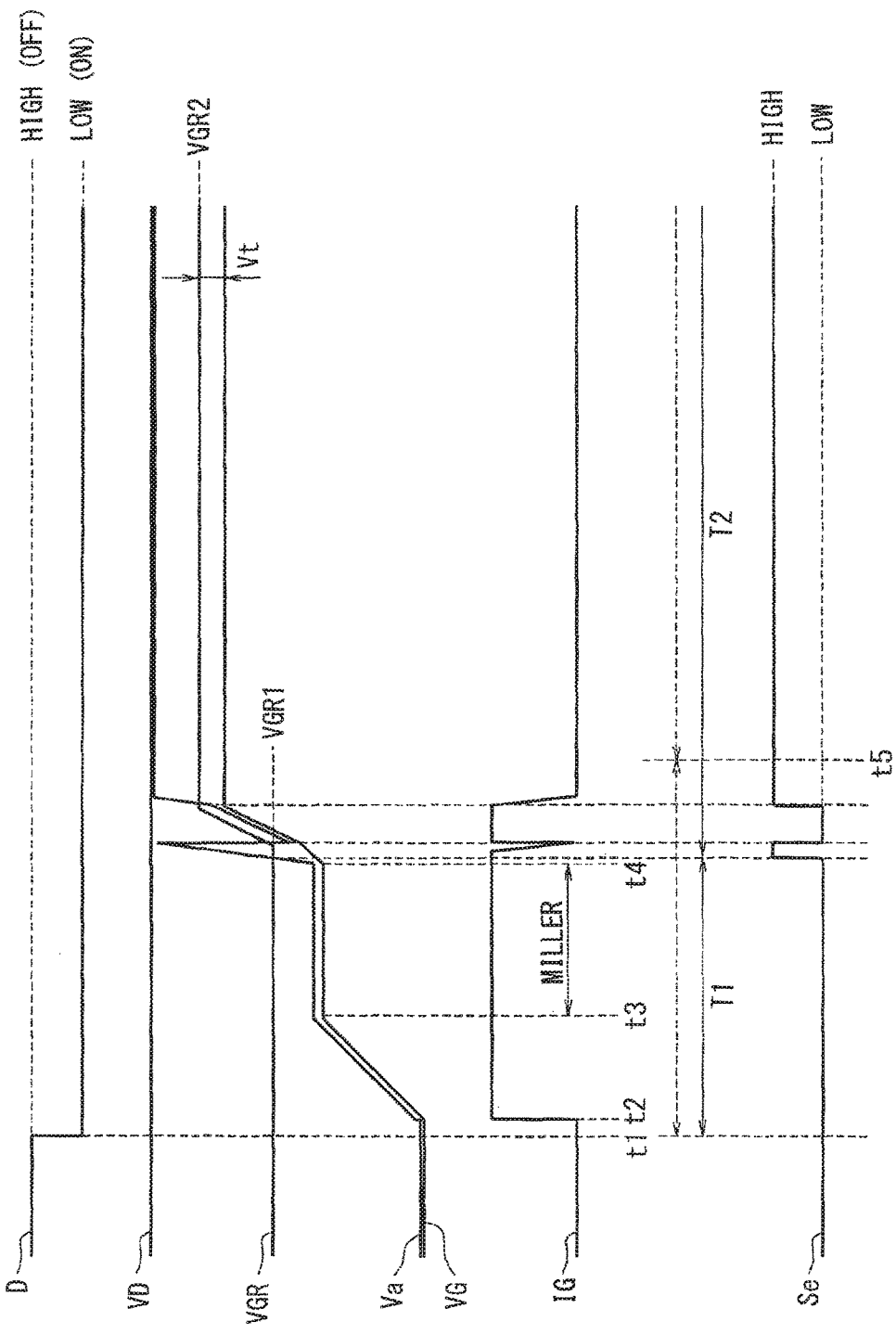
FIG. 15 is a timing diagram of the gate driver of FIG. 14 in a normal state.
Figure 16:
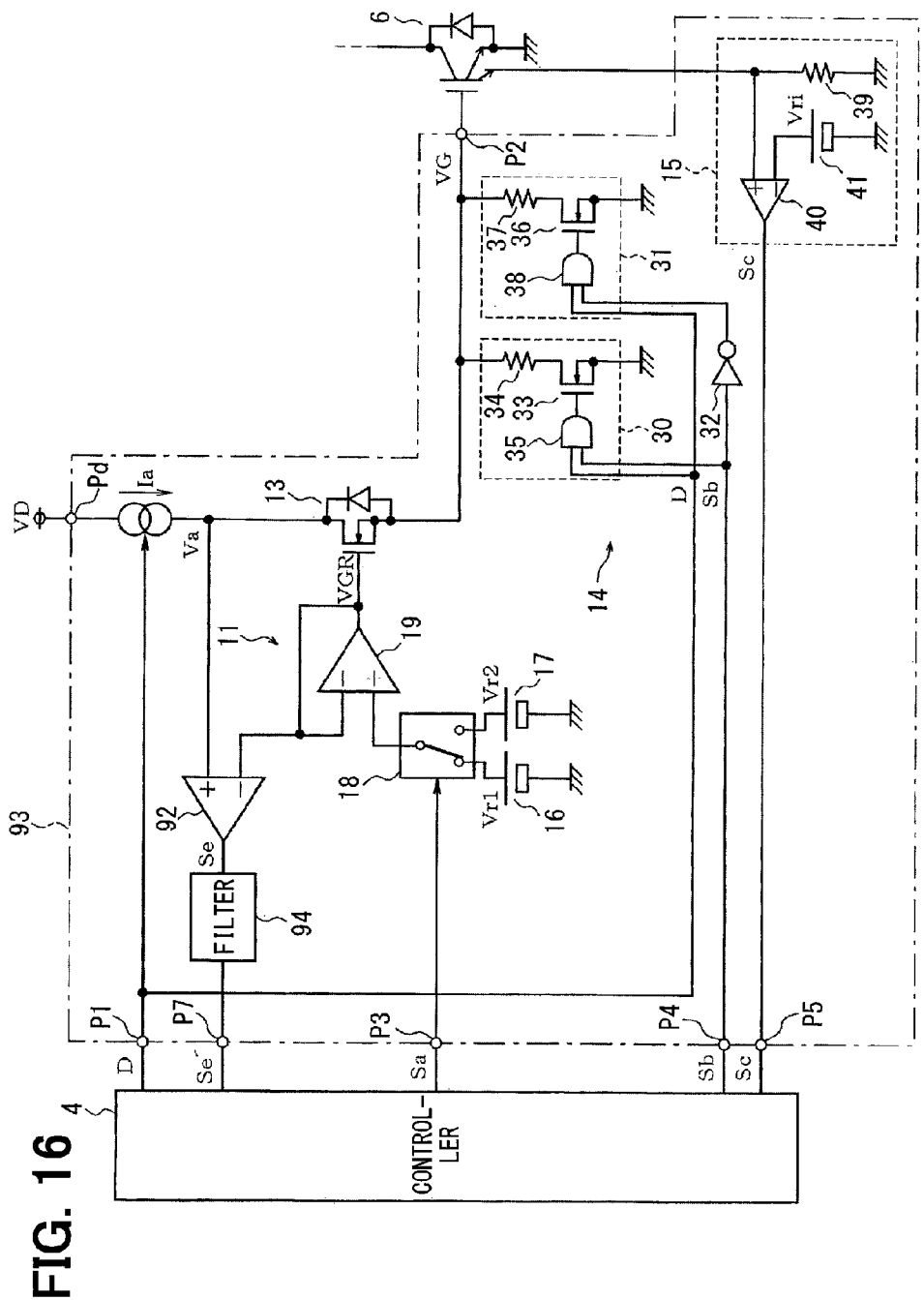
FIG. 16 is a circuit diagram of a gate driver according to a modification of the sixth embodiment.

A sixth embodiment of the present disclosure is described below with reference to FIGS. 14-16.

Figure 14:
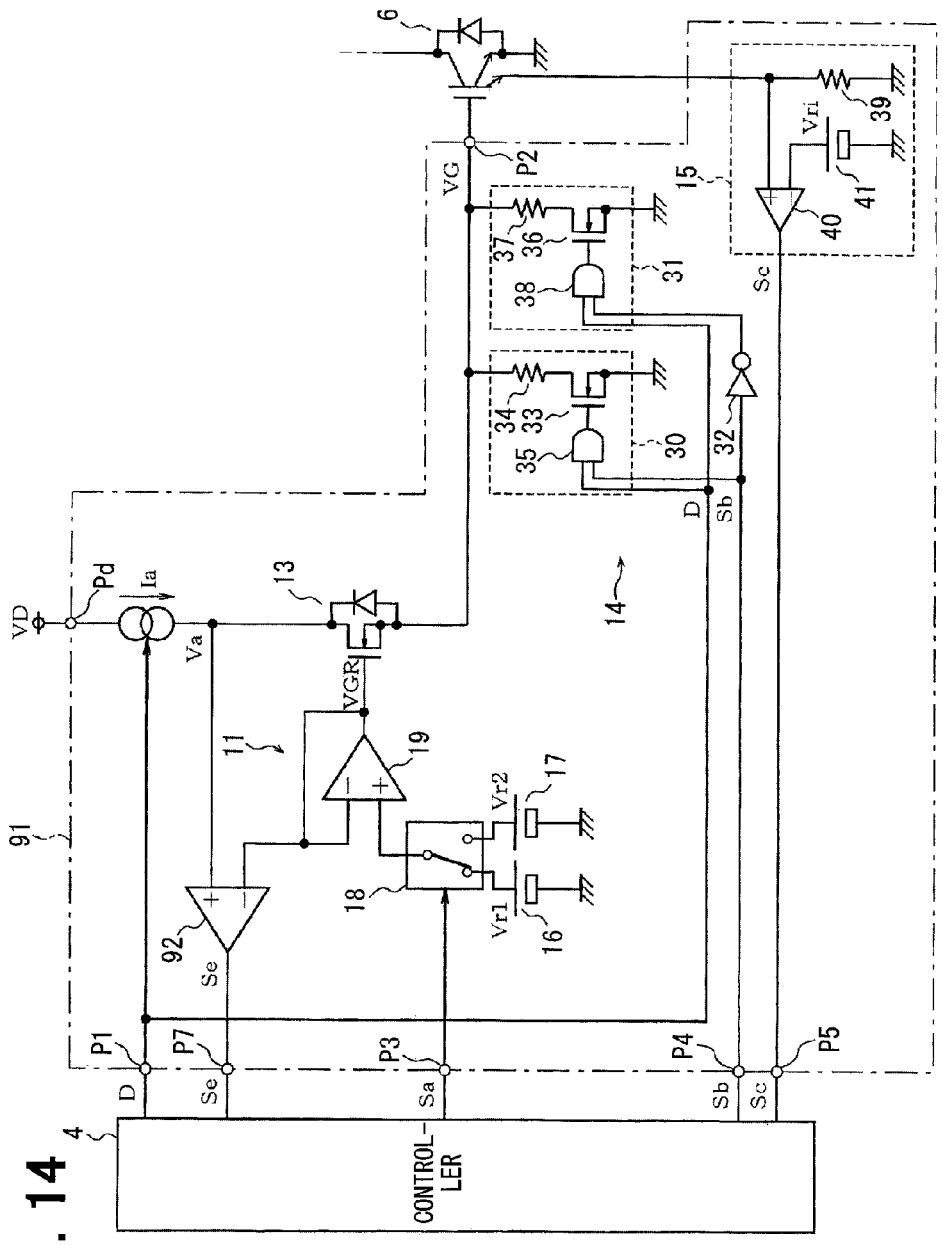
FIG. 14 is a circuit diagram of a gate driver according to a sixth embodiment of the present disclosure.

As shown in FIG. 14, a gate driver 91 according to the sixth embodiment differs from the gate driver 7 according to the first embodiment in that the gate driver 91 has a comparator 92. A voltage Vα of the output terminal of the constant current circuit 12 is supplied to a non-inverting input terminal of the comparator 92. A gate voltage (i.e., the gate reference voltage VGR) of the voltage output transistor 13 is supplied to an inverting input terminal of the comparator 92. An output signal of the comparator 92 is supplied as a change control signal Se to the controller 4 through a terminal P7.

In the above structure, when the voltage output transistor 13 is ON, the voltage Vα is less than the gate reference voltage VGR, so that the change control signal Se is at a L level. In contrast, when the voltage output transistor 13 is OFF (or almost OFF), the voltage Vα is greater than the gate reference voltage VGR, so that the change control signal Se is at a H level.

The controller 4 determines the timing of the transition from the first period T1 to the second period T2 based on the levels of the change control signal Se and the overcurrent determination signal Sc. That is, as shown in FIG. 15, when the gate voltage VG restarts to increase after the Miller period in the first period T1 and then reaches the limit value (VGR1−Vt) which depends on the first setting value VGR1, the voltage output transistor 13 is turned OFF. Then, the voltage Vα exceeds the gate reference voltage VGR so that the change control signal Se changes to a H level (time ta). The controller 4 sets the voltage switch signal Sa to a L level under condition that the overcurrent determination signal Sc is at a L level. Accordingly, the transition from the first period T1 to the second period T2 occurs.

The same effect and advantage as obtained in the sixth embodiment can be obtained in the first embodiment. Further, the sixth embodiment can provide the following advantage. In fact, it is preferable that the IGBT 6 should be fully turned ON immediately after the Miller period ends in order to reduce conduction loss. However, in the first embodiment, since the transition timing is set to when a predetermined period of time elapses after the ON instruction is received or after the gate voltage VG exceeds the predetermined threshold, a period (i.e., the first period T1) where the IGBT 6 is not fully turned ON lasts for a while (from the time t4 to the time t5 in FIG. 4) after the Miller period ends.

In contrast, according to the sixth embodiment, the transition timing is set to when the voltage Vα of the output terminal of the constant current circuit 12 exceeds the gate voltage (i.e., gate reference voltage VGR) of the voltage output transistor 13. In such an approach, the transition to the second period T2 occurs immediately after the Miller period ends, so that the IGBT 6 can be fully turned ON. Thus, after the Miller period ends, the first period T1 lasts for a short period compared to that in the first embodiment. The conduction loss in the IGBT 6 is reduced accordingly.

In the above structure, there is a risk that when noise is superimposed on input and output signals of the comparator 92, the transition from the first period T1 to the second period T2 may occur at an incorrect timing. This risk can be overcome by a gate driver 93 shown in FIG. 16. The gate driver 93 differs from the gate driver 91 shown in FIG. 14 in that the gate driver 93 has a filter 94 for receiving the change control signal Se outputted from the comparator 92. It is noted that a delay time of the filter 94 is set less than the first period T1. In this case, an output signal of the filter 94 is supplied as a change control signal Se' to the controller 4 through the terminal P7, and the controller 4 sets the transition timing based on the levels of the change control signal Se' and the overcurrent determination signal Sc. In such an approach, it is possible to prevent the transition from the first period T1 to the second period T2 from occurring at the incorrect timing due to noise or the like.

(Modifications)

While the present disclosure has been described with reference to the embodiments, it is to be understood that the disclosure is not limited to the embodiments. The present disclosure is intended to cover various modifications and equivalent arrangements inside the spirit and scope of the present disclosure. For example, the embodiments can be modified as follows.

A target device to be driven by the gat drive circuit is not limited to an IGBT, but includes a MOS transistor and a voltage-driven semiconductor device (transistor).

The gate reference voltage generation circuits 11 and 62 are not limited to the structures shown in FIGS. 2 and 10, respectively, and can have other circuit structures which can achieve the same functions as those shown in FIGS. 2 and 10. For example, the operational amplifier 19 as a voltage follower can be removed from the gate reference voltage generation circuit 11 if the voltage output transistor 13 can be driven directly by the first reference voltage Vr1 and the second reference voltage Vr2.

At least one of the voltage output transistor 13 and the backflow prevention transistor 52 can be an NPN bipolar transistor. The backflow prevention transistor 52 can be replaced with a device other than a transistor such as a diode connected in a reverse direction in the gate current supply path to prevent a backflow of current in the gate current supply path.

A gate off drive circuit to turn OFF the IGBT 6 is not limited to the structure of the gate off drive circuit 14 shown in FIG. 2 having two gate capacitance discharging paths with different impedances. For example, the gate off drive circuit can have only one gate capacitance discharging path.

In the fifth embodiment, the controller 4 can control the current bypass circuit 82 so that the current bypass path can be formed in a period other than the first period T1.

The current bypass circuit 82 is not limited to the structure shown in FIG. 12, but includes another circuit structure which can achieve the same function as that shown in FIG. 12. For example, the current bypass circuit 82 can have a constant current circuit instead of the resistor 83.

Such changes and modifications are to be understood as being inside the scope of the present disclosure as defined by the appended claims

What is claimed is:

1. A gate driver comprising:
   a gate reference voltage generation circuit configured to output a gate reference voltage as a reference for a drive voltage to turn ON a first transistor, the gate reference voltage generation circuit further configured to change the gate reference voltage to be outputted between at least two values;
   a constant current circuit configured to supply constant current to a gate of the first transistor;
   a second transistor connected in a forward direction in series between the constant current circuit and the gate of the first transistor in a gate current supply path from a power supply voltage (VD) through the constant current circuit to the gate of the first transistor, the second transistor being an N channel or NPN transistor and having a gate supplied with the gate reference voltage;
   a drive controller configured to drive the gate of the first transistor with the constant current by operating the constant current circuit when an ON instruction is inputted;
   a voltage change controller configured to set a value of the gate reference voltage to be outputted by the gate reference voltage generation circuit to a first setting value or a second setting value greater than the first setting value, and
   an overcurrent detector configured to determine whether the first transistor is in an overcurrent state where excessive current greater than a predetermined failure threshold flows in the first transistor, wherein
   the voltage change controller sets the value of the gate reference voltage so that the value of the gate reference voltage is the first setting value when the ON instruction is inputted and then changes the value of the gate reference voltage from the first setting value to the second setting value when a predetermined transition timing comes after a Miller period of the first transistor ends under a condition where the overcurrent detector does not determine that the first transistor is in the overcurrent state.

2. The gate driver according to claim 1, further comprising:
   a backflow preventer configured to prevent a backflow of current in the gate current supply path.

3. The gate driver according to claim 2, wherein
   the backflow preventer is an N channel or NPN transistor connected in a reverse direction in the gate current supply path and having a gate supplied with the gate reference voltage.

4. The gate driver according to claim 1, wherein
   the gate reference voltage generation circuit performs feedback control of the value of the gate reference voltage to be outputted.

5. The gate driver according to claim 1, further comprising:
a current bypass circuit configured to form a current bypass path through which the constant current from the output terminal of the current constant circuit flows, and
the current bypass path is different from the gate current supply path.

6. The gate driver according to claim 5, wherein the current bypass circuit forms the current bypass path in a period from when the ON instruction is inputted to when the transition timing comes.

7. The gate driver according to claim 1, wherein the voltage change controller sets the transition timing to when a voltage of the output terminal of the constant current circuit exceeds a voltage of an output terminal of the gate reference voltage generation circuit.

8. The gate driver according to claim 1, further comprising:
a gate voltage detection circuit configured to detect a gate voltage of the first transistor, wherein
the voltage change controller sets the transition timing to when a predetermined period of time elapses after the gate voltage detected by the gate voltage detection circuit reaches a predetermined threshold which is less than a mirror Miller voltage of the first transistor.

9. The gate driver according to claim 1, wherein the voltage change controller sets the transition timing to when a predetermined period of time elapses after the ON instruction is inputted.

10. A gate driver comprising:
a gate reference voltage generation circuit configured to output a gate reference voltage as a reference for a drive voltage to turn ON a first transistor, the gate reference voltage generation circuit further configured to change the gate reference voltage to be outputted between at least two values;
a constant current circuit configured to supply constant current to a gate of the first transistor;
a second transistor connected in a forward direction in series between the constant current circuit and the gate of the first transistor in a gate current supply path from a power supply voltage (VD) through the constant current circuit to the gate of the first transistor, the second transistor being an N channel or NPN transistor and having a gate supplied with the gate reference voltage;
a drive controller configured to drive the gate of the first transistor with the constant current by operating the constant current circuit when an ON instruction is inputted;
a voltage change controller configured to set a value of the gate reference voltage to be outputted by the gate reference voltage generation circuit to a first setting value or a second setting value greater than the first setting value, and
an overcurrent detector configured to determine whether the first transistor is in an overcurrent state where excessive current greater than a predetermined failure threshold flows in the first transistor, wherein
the voltage change controller sets the value of the gate reference voltage so that the value of the gate reference voltage is the first setting value when the ON instruction is inputted and then changes the value of the gate reference voltage from the first setting value to the second setting value when a predetermined transition timing comes after a Miller period of the first transistor ends under a condition where the overcurrent detector does not determine that the first transistor is in the overcurrent state, and
the gate reference voltage generation circuit performs feedback control of the value of the gate reference voltage to be outputted.

11. A gate driver comprising:
a gate reference voltage generation circuit configured to output a gate reference voltage as a reference for a drive voltage to turn ON a first transistor, the gate reference voltage generation circuit further configured to change the gate reference voltage to be outputted between at least two values;
a constant current circuit configured to supply constant current to a gate of the first transistor;
a second transistor connected in a forward direction in series between the constant current circuit and the gate of the first transistor in a gate current supply path from a power supply voltage (VD) through the constant current circuit to the gate of the first transistor, the second transistor being an N channel or NPN transistor and having a gate supplied with the gate reference voltage;
a drive controller configured to drive the gate of the first transistor with the constant current by operating the constant current circuit when an ON instruction is inputted;
a voltage change controller configured to set a value of the gate reference voltage to be outputted by the gate reference voltage generation circuit to a first setting value or a second setting value greater than the first setting value,
an overcurrent detector configured to determine whether the first transistor is in an overcurrent state where excessive current greater than a predetermined failure threshold flows in the first transistor, wherein
the voltage change controller sets the value of the gate reference voltage so that the value of the gate reference voltage is the first setting value when the ON instruction is inputted and then changes the value of the gate reference voltage from the first setting value to the second setting value when a predetermined transition timing comes after a Miller period of the first transistor ends under a condition where the overcurrent detector does not determine that the first transistor is in the overcurrent state, and
a current bypass circuit configured to form a current bypass path through which the constant current from the output terminal of the current constant circuit flows, and
the current bypass path is different from the gate current supply path.

12. The gate driver according to claim 11, wherein the current bypass circuit forms the current bypass path in a period from when the ON instruction is inputted to when the transition timing comes.

* * * * *